(12) United States Patent
Inadomi et al.

(10) Patent No.: US 11,139,181 B2
(45) Date of Patent: Oct. 5, 2021

(54) SUBSTRATE PROCESSING APPARATUS HAVING PROCESSING BLOCK INCLUDING LIQUID PROCESSING UNIT, DRYING UNIT, AND SUPPLY UNIT ADJACENT TO THE TRANSPORT BLOCK

(71) Applicant: Tokyo Electron Limited, Tokyo (JP)

(72) Inventors: Hiroaki Inadomi, Kumamoto (JP); Tooru Nakamura, Kumamoto (JP); Kouji Kimoto, Kumamoto (JP); Yoshihisa Aoyama, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/143,694

(22) Filed: Sep. 27, 2018

(65) Prior Publication Data

US 2019/0103291 A1 Apr. 4, 2019

(30) Foreign Application Priority Data

Sep. 29, 2017 (JP) .............................. JP2017-189959

(51) Int. Cl.
 *H01L 21/67* (2006.01)
 *H01L 21/677* (2006.01)
 (Continued)

(52) U.S. Cl.
 CPC .... *H01L 21/67034* (2013.01); *B05C 11/1031* (2013.01); *H01L 21/02101* (2013.01);
 (Continued)

(58) Field of Classification Search
 CPC .................. H01L 21/02101; B08B 7/0021
 (Continued)

(56) References Cited

U.S. PATENT DOCUMENTS 10,096,462 B2 * 10/2018 Hayashi ............ H01L 21/02057
10,115,609 B2 * 10/2018 Mitsuoka .......... H01L 21/02057
(Continued)

FOREIGN PATENT DOCUMENTS

| JP | 2003-092244 A | 3/2003 |
| JP | 2013-254904 A | 12/2013 |
| JP | 5497114 B | 3/2014 |

*Primary Examiner* — Karl Kurple
(74) *Attorney, Agent, or Firm* — Abelman, Frayne & Schwab

(57) ABSTRACT

A substrate processing apparatus according to an embodiment includes a transport block and a plurality of processing blocks. In the transport block, a transport device for transporting a substrate is disposed. The plurality of processing blocks are disposed adjacent to the transport block and process the substrate transported by the transport device. Each processing block includes one liquid processing unit and one drying unit. The liquid processing unit performs a liquid film forming processing so as to form a liquid film on the top surface of the substrate. The drying unit performs a supercritical drying processing in which the substrate is dried by bringing the substrate into contact with the processing fluid in a supercritical state. The liquid processing unit and the drying unit included in the same processing block are disposed on the same side with respect to the movement direction of the transport device of the transport block.

12 Claims, 9 Drawing Sheets

(51) Int. Cl.
*H01L 21/02* (2006.01)
*B05C 11/10* (2006.01)

(52) U.S. Cl.
CPC .... *H01L 21/6715* (2013.01); *H01L 21/67017* (2013.01); *H01L 21/6719* (2013.01); *H01L 21/67028* (2013.01); *H01L 21/67161* (2013.01); *H01L 21/67167* (2013.01); *H01L 21/67178* (2013.01); *H01L 21/67207* (2013.01); *H01L 21/67745* (2013.01); *H01L 21/67748* (2013.01)

(58) Field of Classification Search
USPC ..................................................... 134/26, 61
See application file for complete search history.

(56) References Cited

U.S. PATENT DOCUMENTS

| | | | |
|---|---|---|---|
| 10,566,182 B2 * | 2/2020 | Goshi | H01L 21/67028 |
| 2002/0160625 A1 * | 10/2002 | Inoue | H01L 21/67028 438/780 |
| 2003/0019578 A1 * | 1/2003 | Iwata | H01L 21/67161 156/345.22 |
| 2011/0000507 A1 * | 1/2011 | Toshima | H01L 21/02101 134/19 |
| 2011/0000512 A1 * | 1/2011 | Toshima | H01L 21/67057 134/34 |
| 2012/0132230 A1 * | 5/2012 | Toshima | H01L 21/6719 134/19 |
| 2012/0304485 A1 * | 12/2012 | Hayashi | H01L 21/02057 34/415 |
| 2013/0327363 A1 * | 12/2013 | Inadomi | H01L 21/67034 134/26 |
| 2016/0336201 A1 * | 11/2016 | Inadomi | H01L 21/67034 |
| 2017/0069485 A1 * | 3/2017 | Jeong | H01L 21/02057 |
| 2018/0254200 A1 * | 9/2018 | Kawabuchi | H01L 21/67034 |
| 2019/0139791 A1 * | 5/2019 | Kiyose | H01L 21/67253 |
| 2019/0355574 A1 * | 11/2019 | Kanno | H01L 21/67028 |
| 2020/0168482 A1 * | 5/2020 | Inadomi | H01L 21/67757 |
| 2021/0043471 A1 * | 2/2021 | Nakata | H01L 21/02101 |

* cited by examiner

SUBSTRATE PROCESSING APPARATUS HAVING PROCESSING BLOCK INCLUDING LIQUID PROCESSING UNIT, DRYING UNIT, AND SUPPLY UNIT ADJACENT TO THE TRANSPORT BLOCK

CROSS-REFERENCE TO RELATED APPLICATIONS

This application is based on and claims priority from Japanese Patent Application No. 2017-189959, filed on Sep. 29, 2017 with the Japan Patent Office, the disclosure of which is incorporated herein in its entirety by reference.

TECHNICAL FIELD

An exemplary embodiment disclosed herein relates to a technique for removing liquid attached to a surface of a substrate using a supercritical processing fluid.

BACKGROUND

In the related art, a supercritical drying processing has been known in which the surface of a substrate such as, for example, a semiconductor wafer is processed with a liquid, and then the substrate is brought into contact with the supercritical fluid in the state where the surface is wet with the liquid.

As a substrate processing apparatus that performs a supercritical drying processing, Japanese Patent No. 5497114 discloses a substrate processing apparatus for performing a substrate processing apparatus in which a first chamber configured to perform therein a liquid processing on a substrate and a second chamber configured to perform therein a supercritical drying processing on the substrate after the liquid processing are arranged to be opposite to each other with a substrate transport area interposed therebetween.

SUMMARY

A substrate processing apparatus according to an aspect of an embodiment includes a transport block and a plurality of processing blocks. In the transport block, a transport device for transporting a substrate is disposed. The plurality of processing blocks are disposed adjacent to the transport block and process the substrate transported by the transport device. In addition, each processing block includes one liquid processing unit and one drying unit. The liquid processing unit performs a liquid film forming processing so as to form a liquid film on the top surface of the substrate. The drying unit performs a supercritical drying processing in which the substrate after the liquid film forming processing is dried by bringing the substrate after the liquid film forming processing into contact with the processing fluid in a supercritical state. In addition, the liquid processing unit and the drying unit included in the same processing block are disposed on the same side with respect to the movement direction of the transport device of the transport block.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
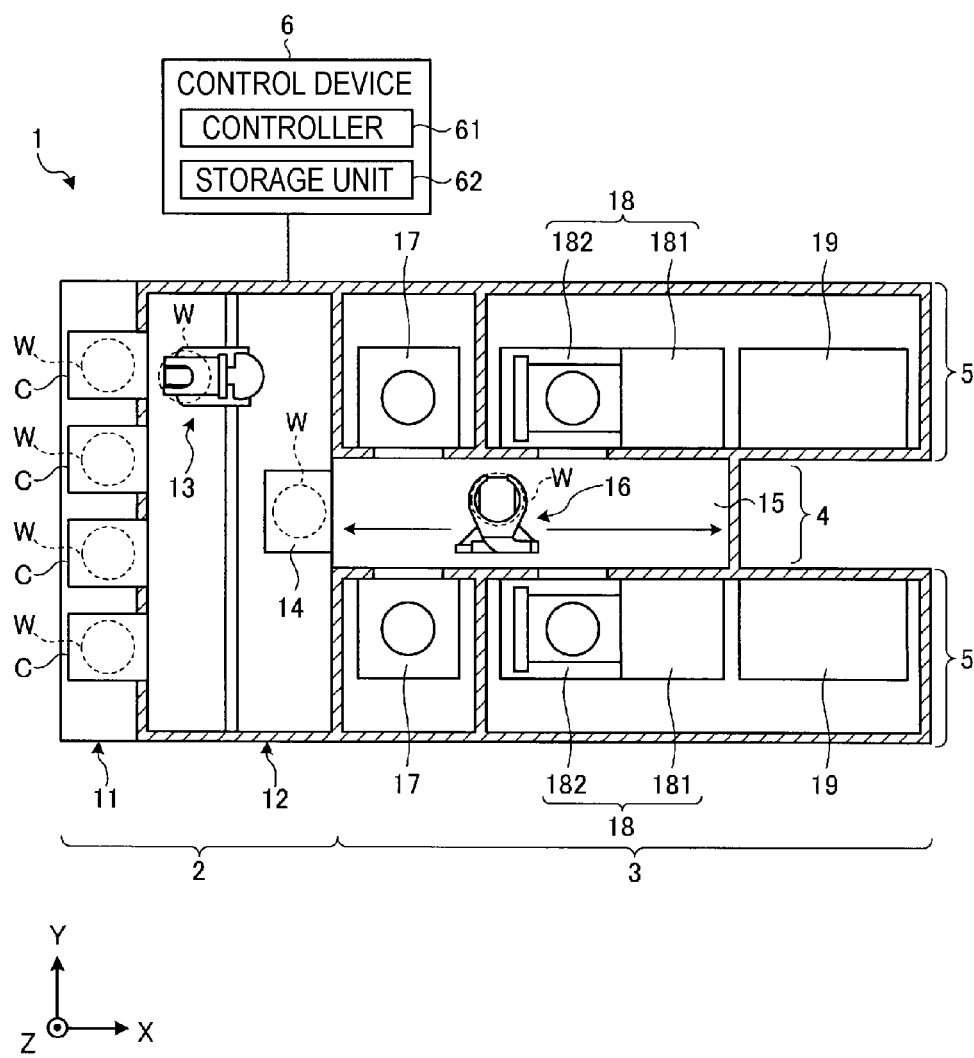
FIG. 1 is a schematic cross-sectional view illustrating a substrate processing system according to an embodiment when viewed from above.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

There is still room for further improvement in the above-mentioned prior art technique in terms of optimization of a series of substrate processings including a liquid processing and a supercritical drying processing.

For example, in the substrate processing apparatus described in Japanese Patent No. 5497114, a transport robot disposed in the transport area takes out the substrate after the liquid processing from the first chamber, rotates about a θ axis, and carries the substrate after the liquid processing into to the second chamber. Therefore, when the transport robot rotates about the θ axis, the liquid on the substrate may be shaken off from the substrate, which may affect the supercritical drying processing.

An aspect of an embodiment aims to provide a substrate processing apparatus capable of optimizing a series of substrate processings including a liquid processing and a supercritical drying processing.

A substrate processing apparatus according to an aspect of an embodiment includes a transport block and a plurality of processing blocks. In the transport block, a transport device for transporting a substrate is disposed. The plurality of processing blocks are disposed adjacent to the transport block and process the substrate transported by the transport device. In addition, each processing block includes one liquid processing unit and one drying unit. The liquid processing unit performs a liquid film forming processing so as to form a liquid film on the top surface of the substrate.

The drying unit performs a supercritical drying processing in which the substrate after the liquid film forming processing is dried by bringing the substrate after the liquid film forming processing into contact with the processing fluid in a supercritical state. In addition, the liquid processing unit and the drying unit included in the same processing block are disposed on the same side with respect to the movement direction of the transport device of the transport block.

In the above-described substrate processing apparatus, the transport device transports the substrate after the liquid film forming processing between the liquid processing unit and the drying unit which are included in the same processing block.

In the above-described substrate processing apparatus, the plurality of processing blocks are disposed in multiple stages.

The above-described substrate processing apparatus further includes: a delivery unit disposed adjacent to the transport block and configured to place the substrate thereon, wherein the transport device transports the substrate between the processing block and the delivery unit disposed in each stage.

In the above-described substrate processing apparatus, the plurality of processing blocks are disposed on both sides of the movement direction of the transport block, and the processing blocks disposed on one side of the transport block and the processing blocks disposed on another side of the transport block are disposed to be symmetrical to each other across the transport block in plan view.

In the above-described substrate processing apparatus, the drying unit includes a processing area in which the supercritical drying process is performed and a delivery area in which delivery of the substrate is performed between the transport block and the processing area, and the processing area and the delivery area are arranged along the transport block.

In the above-described substrate processing apparatus, the delivery area is disposed closer to the liquid processing unit than the processing area.

The above-described substrate processing apparatus further includes: a first exhaust path configured to exhaust the processing fluid in the supercritical state from the processing area; and a second exhaust path configured to evacuate the delivery area.

In the above-described substrate processing apparatus, each of the processing blocks further includes a supply unit configured to supply the processing fluid to the drying unit, and the liquid processing unit, the drying unit, and the supply unit included in the same processing block are disposed on the same side with respect to the movement direction of the transport device of the transport block.

According to one aspect of the embodiment, it is possible to optimize a series of substrate processings including a liquid processing and a supercritical drying processing.

Hereinafter, modes for implementing a substrate processing apparatus according to the present application (hereinafter, referred to as "embodiments") will be described in detail with reference to the drawings. The substrate processing apparatus according to the present disclosure is not limited by this embodiment. In addition, respective embodiments may be appropriately combined within a range not inconsistent with processing contents. Further, in each of the following embodiments, the same components are denoted by the same reference numerals, and duplicate descriptions are omitted.

[1. Configuration of Substrate Processing System]

Figure 2:
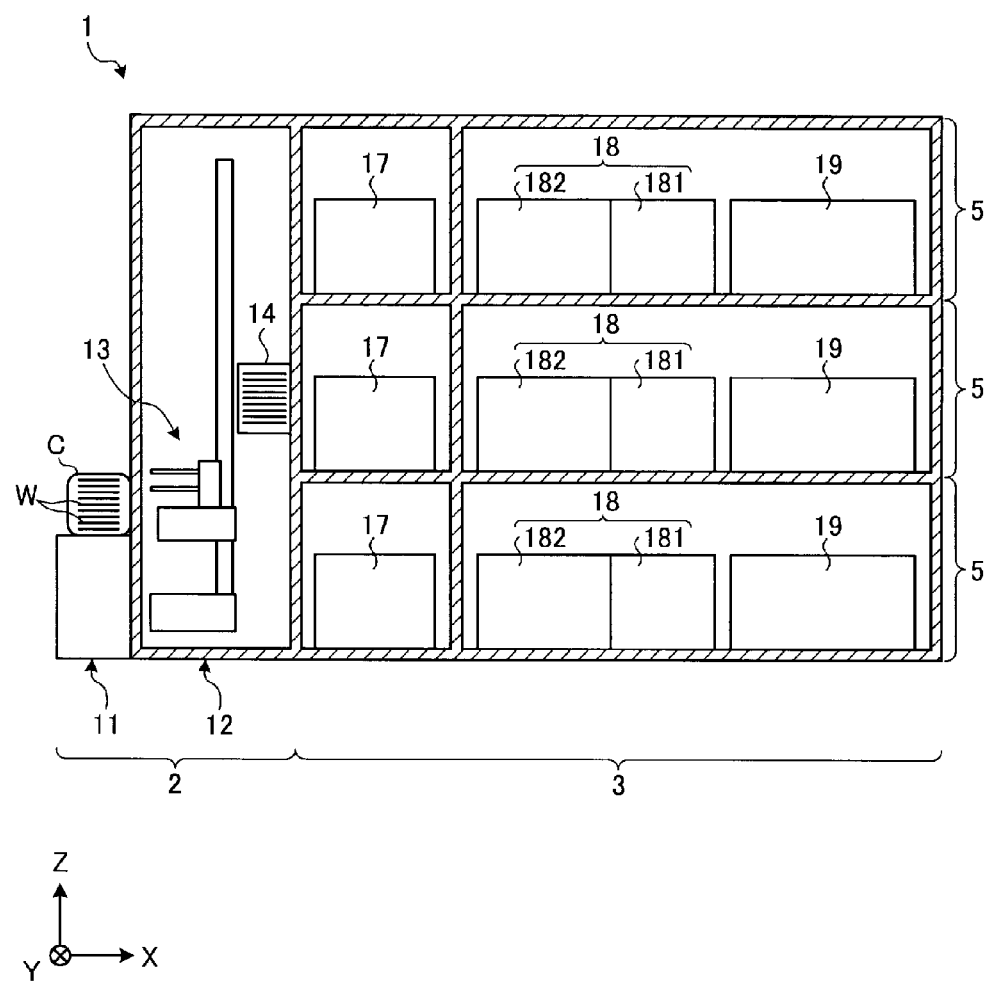
FIG. 2 is a schematic cross-sectional view of the substrate processing system according to the embodiment when viewed from a side.

First, the configuration of a substrate processing system (an example of a substrate processing apparatus) according to an embodiment will be described with reference to FIGS. 1 and 2. FIG. 1 is a schematic cross-sectional view illustrating the substrate processing system according to the embodiment when viewed from above. In addition, FIG. 2 is a schematic cross-sectional view of the substrate processing system according to the embodiment when viewed from a side. In the following description, in order to clarify a positional relationship, an X axis, a Y axis, and a Z axis orthogonal to each other are defined, and the Z-axis positive direction is defined as a vertical upward direction.

As illustrated in FIG. 1, a substrate processing system 1 includes a carry-in/out station 2, and a processing station 3. The carry-in/out station 2 and the processing station 3 are provided adjacent to each other.

(Regarding Carry-In/Out Station 2)

The carry-in/out station 2 includes a carrier placing section 11 and a transport section 12. A plurality of carriers C configured to accommodate a plurality of semiconductor wafers W (hereinafter referred to as "wafers W") in a horizontal state are placed in the carrier placing section 11.

The transport section 12 is provided adjacent to the carrier placing section 11. Inside the carrier section 12, a transport device 13 and a delivery unit 14 are disposed.

The transport device 13 includes a wafer holding mechanism configured to hold a wafer W. Further, the transport device 13 is capable of moving in the horizontal direction and in the vertical direction and rotating about the vertical axis, and transports a wafer W between a carrier C and the delivery unit 14 using a wafer holding mechanism.

(Regarding Processing Station 3)

The processing station 3 is provided adjacent to the transport section 12. The processing station 3 includes a transport block 4 and a plurality of processing blocks 5.

(Regarding Transport Block 4)

The transport block 4 includes a transport area 15 and a transport device 16. The transport area 15 is, for example, a rectangular parallelepiped shape extending in the arrangement direction (X-axis direction) of the carry-in/out station 2 and the processing station 3. In the transport area 15, the transport device 16 is disposed.

The transport device 16 includes a wafer holding mechanism configured to hold a wafer W. Further, the transport device 16 is capable of moving in the horizontal direction and in the vertical direction and rotating about the vertical axis, and transports a wafer W between the delivery unit 14 and the plurality of processing blocks 5 using a wafer holding mechanism.

(Regarding Processing Block 5)

The plurality of processing blocks 5 are arranged adjacent to the transport area 15 on the both sides of the transport area 15. Specifically, the plurality of processing blocks 5 are disposed on one side (the Y-axis positive direction side) and the other side (Y-axis negative direction side) of the transport area 15 in a direction (Y-axis direction) orthogonal to the arrangement direction (X-axis direction) of the carry-in/out station 2 and the processing station 3.

Further, as illustrated in FIG. 2, the plurality of processing blocks 5 are disposed in multiple stages in the vertical direction. In the present embodiment, the number of stages of the plurality of processing blocks 5 is three, but the number of stages of the plurality of processing blocks 5 is not limited to three.

In this way, in the substrate processing system 1 according to the embodiment, the plurality of processing blocks 5 are disposed in multiple stages on the both sides of the transport block 4. In addition, the transport of wafers W between the processing blocks 5 disposed in each stage and the delivery unit 14 is performed by one transport device 16 disposed in the transport block 4.

(Regarding Internal Configuration of Processing Block 5)

Each processing block 5 includes a liquid processing unit 17, a drying unit 18, and a supply unit 19.

The liquid processing unit 17 performs a cleaning processing of cleaning the top surface, which is a pattern forming surface of a wafer W. Further, the liquid processing unit 17 performs a liquid film forming processing for forming a liquid film on the top surface of the wafer W after the cleaning processing. The configuration of the liquid processing unit 17 will be described later.

The drying unit 18 performs a supercritical drying processing on the wafer W after the liquid film forming processing. Specifically, the drying unit 18 dries the wafer W by bringing the wafer W after the liquid film forming processing into contact with a processing fluid in a supercritical state. The configuration of the drying unit 18 will be described later.

The supply unit 19 supplies a processing fluid to the drying unit 18. Specifically, the supply unit 19 includes a supply device group including a flow meter, a flow regulator, a back-pressure valve, a heater, and the like, and a housing accommodating the supply device group. In the present embodiment, the supply unit 19 supplies $CO_2$ as a processing fluid to the drying unit 18.

The liquid processing unit 17, the drying unit 18, and the supply unit 19 are arranged along the transport area 15 (that is, in the X-axis direction). Among the liquid processing unit 17, the drying unit 18, and the supply unit 19, the liquid processing unit 17 is disposed at a position closest to the carry-in/out station 2, and the supply unit 19 is disposed at the farthest position from the carry-in/out station 2.

As described above, each processing block 5 includes one liquid processing unit 17, one drying unit 18, and one supply unit 19. That is, in the substrate processing system 1, the same number of liquid processing units 17, transport devices 16, and supply units 19 are provided.

In addition, the drying unit 18 includes a processing area 181 in which a supercritical drying processing is performed and a delivery area 182 in which delivery of a wafer W between the transport block 4 and a processing area 181 is performed. The processing area 181 and the delivery area 182 are arranged along the transport area 15.

Specifically, of the processing area 181 and the delivery area 182, the delivery area 182 is disposed closer to the liquid processing unit 17 than the processing area 181. That is, in each processing block 5, the liquid processing unit 17, the delivery area 182, the processing area 181, and the supply unit 19 are arranged in this order along the transport area 15.

(Regarding Control Device 6)

The substrate processing system 1 includes a control device 6. The control device 6 is, for example, a computer, and includes a controller 61 and a storage unit 62.

The control unit 61 includes a microcomputer or various circuit including a central processing unit (CPU), a read only memory (ROM), a random access memory (RAM), an input/output port, and the like. The CPU of such a microcomputer reads and executes a program stored in the ROM so as to realize the controls of the transport devices 13 and 16, the liquid processing unit 17, the drying unit 18, the supply unit 19, and the like.

In addition, such a program may be recorded in a computer-readable recording medium and installed in the storage unit 62 of the control device 6 from the recording medium. The computer-readable recording medium includes a hard disk (HD), a flexible disk (FD), a compact disk (CD), a magneto optical disk (MO), a memory card, and the like.

The storage unit 62 is realized by, for example, a semiconductor memory element such as a RAM or a flash memory, or a storage device such as a hard disk or an optical disk.

[2. Transport Flow]

Figure 3:
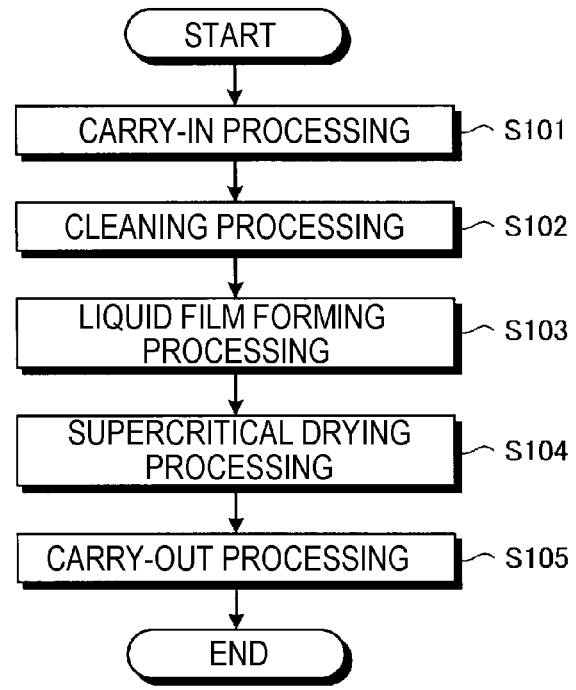
FIG. 3 is a flowchart illustrating a procedure of a series of substrate processings executed in the substrate processing system according to the embodiment.
Figure 4:
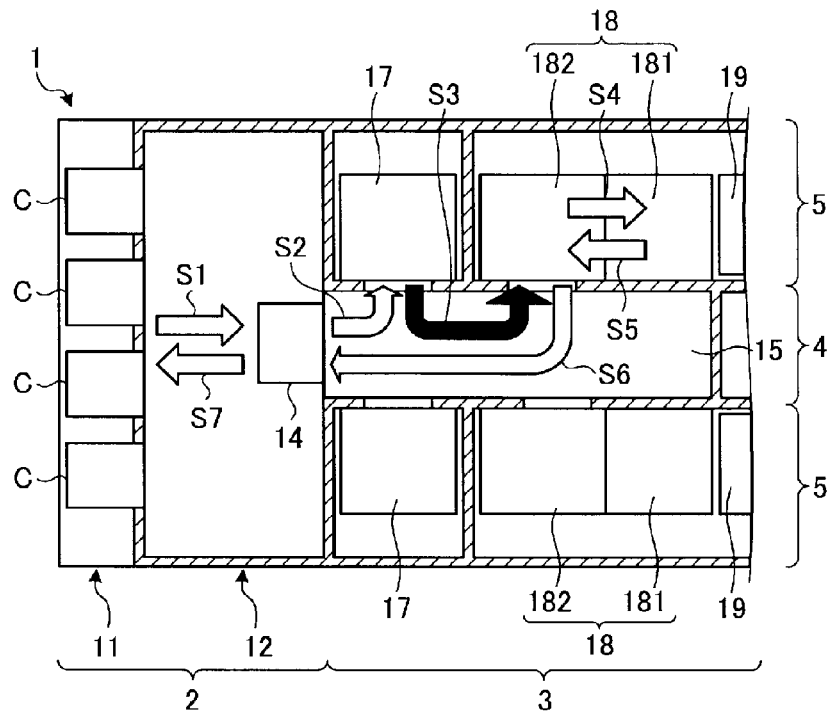
FIG. 4 is a view illustrating a wafer transport procedure.
Figure 5:
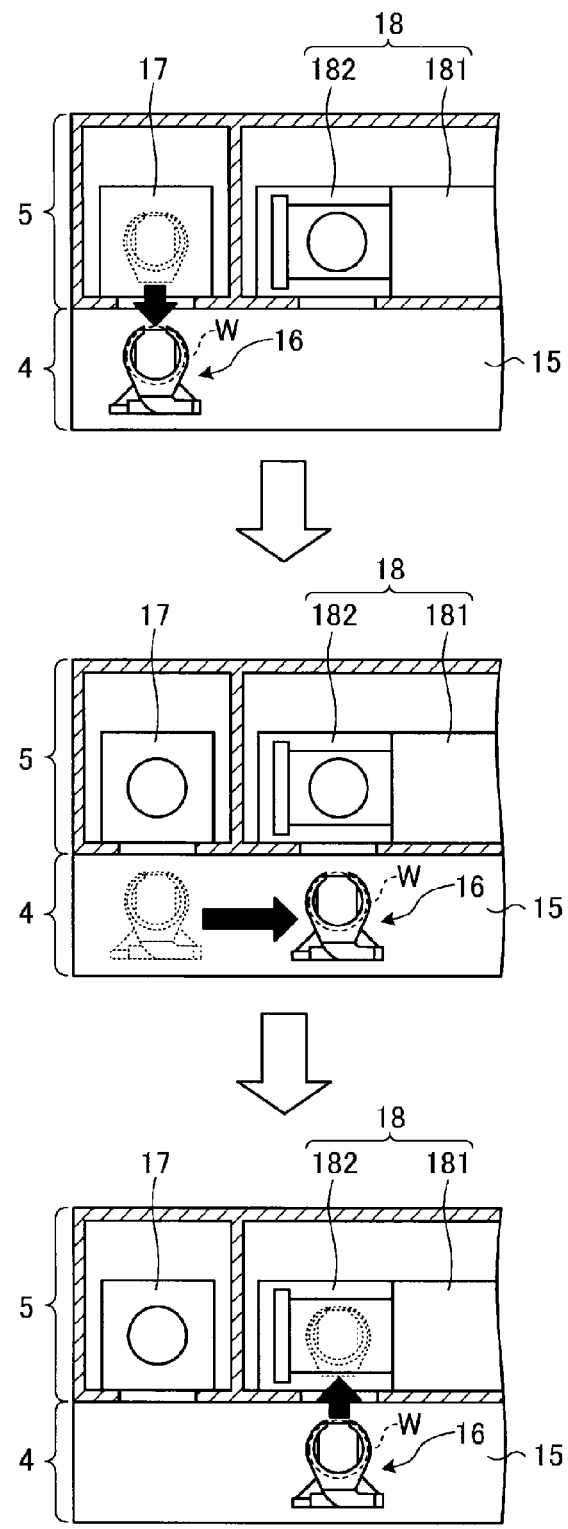
FIG. 5 is a view illustrating an operation example of a transport device in a procedure S3 illustrated in FIG. 4.

Next, a transport flow of a wafer W in the above-described substrate processing system 1 will be described with reference to FIGS. 3 to 5. FIG. 3 is a flowchart illustrating a procedure of a series of substrate processings executed in the substrate processing system 1 according to the embodiment. FIG. 4 is a view illustrating a transport procedure of the wafer W. FIG. 5 is a view illustrating an operation example of the transport device 16 in step S3 illustrated in FIG. 4. The series of substrate processings illustrated in FIG. 3 are executed under the control of the control unit 61.

As illustrated in FIG. 3, in the substrate processing system 1, first, a carry-in processing is performed (step S101). In the carry-in process, the transport device 13 (see, e.g., FIG. 1) takes out a wafer W from a carrier C and places the wafer W on the delivery unit 14 (see, e.g., step S1 in FIG. 4). Subsequently, the transport device 16 (see, e.g., FIG. 1) takes out the wafer W from the delivery unit 14 and carries the wafer W into a liquid processing unit 17 (see, e.g., step S2 in FIG. 4).

Subsequently, in the substrate processing system 1, a cleaning processing is performed in the liquid processing unit 17 (step S102). The liquid processing unit 17 removes particles, a natural oxide film, and the like from the top surface of the wafer W by supplying various processing liquids to the top surface, which is the pattern forming surface of the wafer W.

Subsequently, in the substrate processing system 1, a liquid film forming processing is performed in the liquid processing unit 17 (step S103). The liquid processing unit 17 supplies IPA in a liquid state (hereinafter, referred to as "IPA liquid") to the top surface of the wafer W after the cleaning processing, thereby forming a liquid film of IPA liquid on the top surface of the wafer W.

The wafer W after the liquid film forming processing is transported to the delivery area 182 of the drying unit 18 disposed in the same processing block 5 by the transport device 16 (see, e.g., step S3 in FIG. 4).

Specifically, as illustrated in FIG. 5, after the transport device 16 moves to a position facing the liquid processing unit 17, the transport device 16 introduces the wafer holding mechanism into the liquid processing unit 17 and takes out the wafer W after the liquid film forming processing from the liquid processing unit 17 (see, e.g., the upper view in FIG. 5).

Subsequently, the transport device 16 horizontally moves along the transport area 15, thereby transporting the wafer W after the liquid film forming processing to a position facing the delivery area 182 of the drying unit 18 (see, e.g., the middle view in FIG. 5). At this time, the transport device 16 slides in the horizontal direction while maintaining the state when the wafer W after the liquid film forming processing is taken out from the liquid processing unit 17, specifically, the state where the wafer holding mechanism faces the processing block 5 to be processed.

Thereafter, the transport device 16 introduces the wafer holding mechanism into the transport area 15, and delivers the wafer W after the liquid film forming processing to the drying unit 18 (see, e.g., the lower view in FIG. 5). FIG. 5 only illustrates the operation of horizontal movement. However, when the height of placing the wafer W in the liquid processing unit 17 is different from the height of placing the wafer W in the delivery area 182, a control for causing the transport device 16 to perform a vertical movement is added in order to adjust the difference in the heights during the transportation of the wafer W.

As described above, in the substrate processing system 1 according to the embodiment, the liquid processing unit 17 and the drying unit 18 included in the same processing block 5 are disposed on the same side with respect to the movement direction of the transport device 16 of the transport block 4 (here, the horizontal direction (X-axis direction)). This makes it possible to optimize the substrate processing in terms of simplification of the transport operation and high speed. For example, when the liquid processing unit 17 and the drying unit 18 are disposed on the opposite sides with respect to the movement direction of the transport device 16, it is necessary for the transport device 16 to perform a rotating operation about the θ axis (vertical axis) when the transport device 16 transports the wafer W after the liquid film forming processing from the liquid processing unit 17 to the drying unit 18. On the other hand, the substrate processing system 1 according to the present embodiment does not need to perform this rotating operation. Therefore, by performing the rotating operation about the θ axis, there is no possibility that the liquid film formed on the top surface of the wafer W is shaken off from the wafer W. In addition, compared to the case of performing the rotating operation, it is possible to shorten the transport time of the wafer W after the liquid film forming processing from the liquid processing unit 17 to the drying unit 18. In this specification, the "movement direction of the transport device 16" refers to the movement direction in the horizontal direction (here, the X-axis direction) or the vertical direction (the Z-axis direction), and does not include the advancing/retracting direction of the wafer holding mechanism (here, the Y-axis direction).

In addition, the transport device 16 transports the wafer W after the liquid film forming processing between the liquid processing unit 17 and the drying unit 18 included in the same processing block 5. In each processing block 5, the liquid processing unit 17 and the drying unit 18 are arranged in a one-to-one relationship. Therefore, for example, compared to a substrate processing apparatus in which a plurality of drying units are provided for one liquid processing unit, it is possible to uniform transport times of wafers W after the liquid film forming processing from the liquid processing unit 17 to the drying unit 18.

That is, in a substrate processing apparatus in which a plurality of drying units are provided for one liquid processing unit, variation occurs in transport time between a case where a wafer after the liquid film forming processing is transported to a drying unit disposed in a position close to the liquid processing unit and a case where a wafer after the liquid film forming processing is transported to the drying unit disposed at a position far from the liquid processing unit. On the other hand, in the substrate processing system 1 according to the embodiment, a wafer W after the liquid film forming processing (a wafer W which has been processed by one liquid processing unit 17) is transported to a single drying unit 18 disposed in the same processing block 5 as the liquid processing unit 17. For this reason, variation in the transport time occurs hardly.

In each processing block 5, the delivery area 182 of the drying unit 18 is disposed at a position adjacent to the liquid processing unit 17. Specifically, of the processing area 181 and the delivery area 182 of the drying unit 18, the delivery area 182 is disposed at a position close to the liquid processing unit 17, and the processing area 181 is located farther from the liquid processing unit 17 than the delivery area 182. Therefore, compared to the case where of the processing area 181 and the delivery area 182, the processing area 181 is disposed near the liquid processing unit 17, it is possible to shorten the transport time of the wafer W after the liquid film forming processing.

The processing area 181 and the delivery area 182 are arranged along the transport area 4. Therefore, for example, compared to the case where the processing area 181 is disposed in the inner from the delivery area 182 when viewed from the transport block 15, access to the delivery area 182 at the time of maintenance may be easily performed.

Further, the plurality of processing blocks 5 are disposed in multiple stages (see, e.g., FIG. 2). Therefore, according to the substrate processing system 1 according to the embodiment, it is possible to suppress an increase in footprint.

Returning to FIG. 3, descriptions of a series of substrate processings will be continued. After the liquid film forming processing carried to the delivery area 182, the wafer W is transported from the delivery area 182 to the processing area 181 (see, e.g., step S4 in FIG. 4). In the substrate processing system 1, a supercritical drying processing is performed in the processing area 181 (step S104). In the supercritical drying process, the drying unit 18 brings the wafer W after the liquid film forming processing into contact with the processing fluid in the supercritical state, thereby drying the wafer W after the liquid film forming processing.

Subsequently, in the substrate processing system 1, a carry-out processing is performed in the liquid processing unit 17 (step S105). In the carry-out processing, first, the wafer W after the supercritical drying processing is transported from the processing area 181 to the delivery area 182 (see, e.g., step S5 in FIG. 4). Thereafter, the transport device 16 takes out the wafer W after the supercritical drying processing from the delivery area 182 and transports the wafer W to the delivery unit 14 (see, e.g., step S6 in FIG. 4). Thereafter, the transport device 13 takes out the wafer W after the supercritical drying processing from the delivery unit 14 and transports the wafer W to the carrier C (see, e.g., step S7 in FIG. 4). Upon completion of the carry-out processing, a series of substrate processing for one wafer W are completed.

As illustrated in FIG. 1, in the substrate processing system 1 according to the embodiment, the processing block 5 disposed on one side of the transport block 4 and the processing block 5 disposed on the other side of the transport block 4 are disposed to be symmetrical to each other across the transport block 4 in plan view. Therefore, when viewed in one stage, the transport times of the wafer W in steps S2 to S6 in FIG. 4 may be adjusted with the processing block 5 disposed on one side of the transport block 4 and the processing block disposed on the other side of the transport block 4.

[3. Configuration of Liquid Processing Unit]

Figure 6:
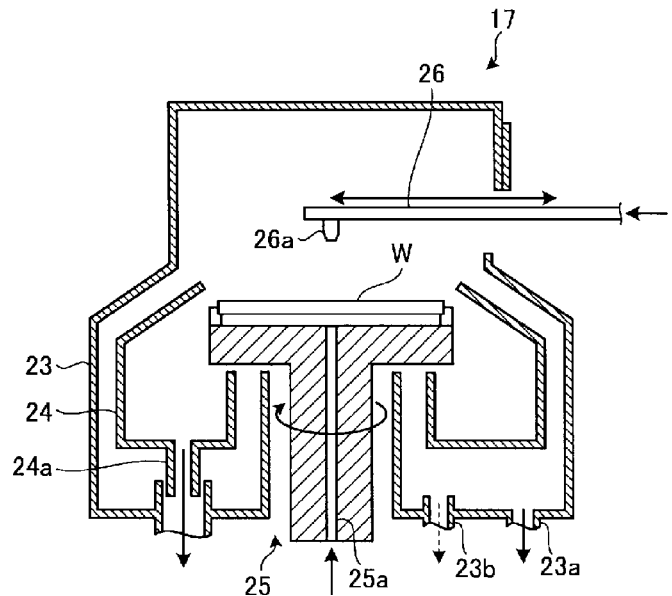
FIG. 6 is a view illustrating a configuration example of a liquid processing unit.

Next, the configuration of the liquid processing unit 17 will be described with reference to FIG. 6. FIG. 6 is a view a configuration example of the liquid processing unit 17. The liquid processing unit 17 is configured as, for example, a single-wafer type cleaning apparatus that cleans the wafers W one by one by spin cleaning.

As illustrated in FIG. 6, the liquid processing unit 17 holds the wafer W substantially horizontally by a wafer holding mechanism 25 disposed inside an outer chamber 23 forming a processing space, and rotates the wafer holding mechanism 25 around the vertical axis, thereby rotating the wafer W. In addition, the liquid processing unit 17 introduces a nozzle arm 26 above the rotating wafer W and supplies a chemical liquid and a rinse liquid from the chemical liquid nozzle 26a provided at the tip end of the nozzle arm 26 in a predetermined order, thereby performing a cleaning processing on the top surface of the wafer W.

In the liquid processing unit 17, a chemical liquid supply path 25a is also formed inside the wafer holding mechanism 25. Then, the bottom surface of the wafer W is also cleaned by the chemical liquid and the rinse liquid supplied from the chemical liquid supply path 25a.

In the cleaning processing, for example, particles and organic pollutants are first removed by SC1 solution (a mixture of ammonia and hydrogen peroxide solution) which is an alkaline chemical solution, and then rinse cleaning is performed with deionized water (hereinafter, referred to as "DIW") which is a rinse liquid. Next, removal of a natural oxide film is performed by diluted hydrofluoric acid solution (hereinafter, referred to as "DHF") which is an acidic chemical solution, and then rinse cleaning with DIW is performed.

The aforementioned various chemical liquids are received by the outer chamber 23 or the inner cup 24 disposed inside the outer chamber 23 and are discharged through a liquid discharge port 23a provided in the bottom of the outer chamber 23 or a liquid discharge port 24a provided in the bottom of the inner cup 24. Further, the atmosphere in the outer chamber 23 is exhausted from the exhaust port 23b provided in the bottom of the outer chamber 23.

The liquid film forming processing is performed after the rinse processing in the cleaning processing. Specifically, the liquid processing unit 17 supplies IPA liquid to the top and bottom surfaces of the wafer W while rotating the wafer holding mechanism 25. As a result, DIW remaining on both sides of the wafer W is replaced with IPA. Thereafter, the liquid processing unit 17 slowly stops the rotation of the wafer holding mechanism 25.

The wafer W, on which the liquid film forming processing has been completed, is delivered to the transport device 16 by a delivery mechanism (not illustrated) provided in the wafer holding mechanism 25 in the state in which the liquid film of the IPA liquid is formed on the top surface of the wafer W, and is carried out from the processing unit 17. The liquid film formed on the wafer W prevents occurrence of pattern collapse by evaporating (vaporizing) the liquid on the top surface of the wafer W during the transport of the wafer W from the liquid processing unit 17 to the drying unit 18 and during the carry-in operation into the drying unit 18.

[4. Configuration of Drying Unit]

Figure 7:
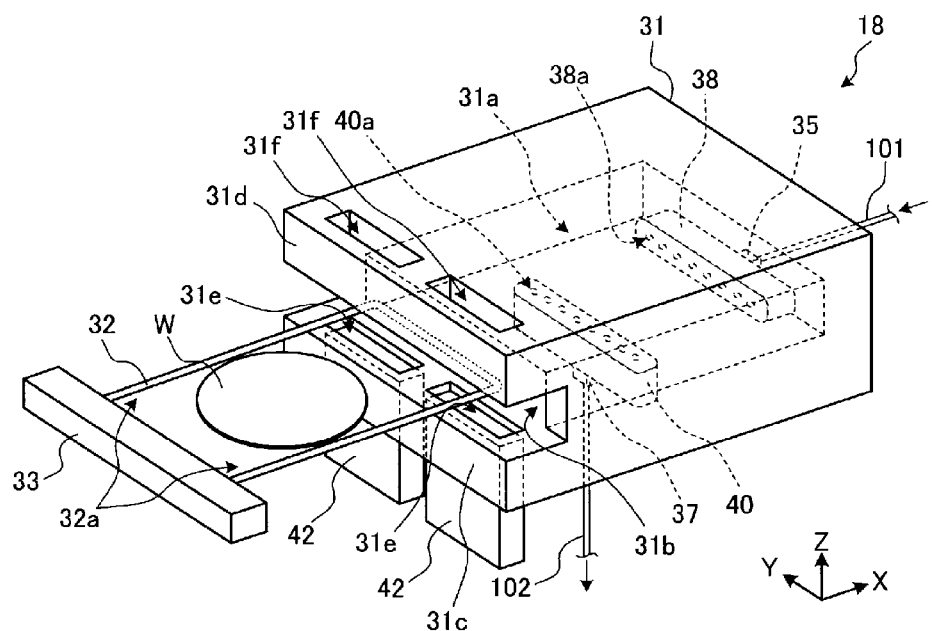
FIG. 7 is a schematic perspective view illustrating a configuration example of a drying unit.

Next, the configuration of the drying unit 18 will be described with reference to FIG. 7. FIG. 7 is a schematic perspective view illustrating a configuration example of the drying unit 18.

As illustrated in FIG. 7, the drying unit 18 includes a processing container 31, a holding body 32, and a lid 33.

The processing container 31 is a pressure vessel capable of forming a high-pressure environment of, for example, about 16 to 20 MPa. The processing container 31 is disposed in the processing area 181 (see, e.g., FIG. 1), and the supercritical drying processing is performed in the processing space 31a inside the processing container 31. An opening 31b for communicating the processing space 31a and the delivery area 182 is formed on in the side surface of the processing container 31 facing the delivery area 182 (see, e.g., FIG. 1).

The holding body 32 holds the wafer W in the horizontal direction. The lid 33 supports the holder 32. The lid 33 is connected to a moving mechanism (not illustrated), and moves horizontally between the processing area 181 and the delivery area 182 together with the holding body 32 by the moving mechanism. By moving to the processing area 181, the holding body 32 is disposed in the processing space 31a of the processing container 31, and the lid 33 closes the opening 31b of the processing space 31a.

The processing vessel 31 is provided with a supply port 35 and a discharge port 37. The supply port 35 is connected to a supply pipe 101 through which the processing fluid supplied to the processing space 31a flows. The supply pipe 101 is connected to the supply device group of the supply unit 19. The discharge port 37 is connected to an individual exhaust pipe 102 through which the processing fluid discharged from the processing space 31a flows.

The supply port 35 is provided on the side surface of the processing chamber 31 opposite to the side on which the opening 31b is formed. Further, the discharge port 37 is provided in the bottom surface of the processing chamber 31. FIG. 7 illustrates one supply port 35 and one discharge port 37, the number of supply ports 35 and the number of discharge ports 37 are not particularly limited.

In the processing space 31a, a supply header 38 and a discharge header 40 are provided. The supply header 38 is connected to the supply port 35 and supplies the processing fluid to the processing space 31a. The discharge header 40 is connected to the discharge port 37 and discharges the processing fluid from the processing space 31a.

The supply header 38 is provided with a plurality of supply ports 38a in the longitudinal direction (Y-axis direction) thereof. The plurality of supply ports 38a are opened toward the opening 31b. The discharge header 40 is provided with a plurality of discharge ports 40a in the longitudinal direction (Y-axis direction) thereof. The plurality of discharge ports 40a are open upwards.

While supplying the processing fluid from the plurality of supply ports 38a of the supply header 38 to the processing space 31a, the drying unit 18 discharges the processing fluid in the processing space 31a through the plurality of discharge ports 40a of the discharge header 40. A damper for adjusting the discharge amount of the processing fluid from the processing space 31a is provided in the discharge path of the processing fluid, and the discharge amount of the processing fluid is adjusted by the damper such that the pressure in the processing space 31a is adjusted to a desired pressure. As a result, the supercritical state of the processing fluid is maintained from the processing space 31a. Hereinafter, the processing fluid in the supercritical state is referred as "supercritical fluid."

In the processing space 31a, a laminar flow of the supercritical fluid is formed which flows in a predetermined direction around the wafer W. The laminar flow of the supercritical fluid flows from the supply header 38, for example, along the top surface of the wafer W above the wafer W toward the upper portion of the opening 31b. Furthermore, the laminar flow of the supercritical fluid turns downward from the upper side of the opening 31b, passes through the vicinity the opening 31b, and flows toward the discharge header 40.

In the example of the laminar flow, in the inside of the processing space 31a, the laminar flow of the supercritical fluid passes through the opening 32a formed between the wafer W and the lid 33 in the holding body 32.

The IPA liquid present on the pattern forming surface (top surface) of the wafer W comes into contact with the supercritical fluid in a high-pressure state (e.g., 16 MPa), thereby gradually dissolving in the supercritical fluid and finally being replaced by the supercritical fluid. As a result, the gaps between the patterns are filled with the supercritical fluid.

Thereafter, the drying unit 18 reduces the pressure in the processing space 31a from the high-pressure state to the atmospheric pressure. As a result, the supercritical fluid that has filled the gaps between the patterns changes to a normal processing fluid, i.e. a gaseous processing fluid.

In this way, the drying unit 18 removes the IPA liquid from the pattern forming surface by replacing the IPA liquid present on the pattern forming surface with the supercritical fluid and then returning the supercritical fluid to the gaseous processing fluid.

The supercritical fluid has a lower viscosity than a liquid (e.g., the IPA liquid) and has a high ability to dissolve a liquid, and furthermore, there is no interface between a supercritical fluid and a liquid or gas in an equilibrium state. Therefore, by performing the supercritical drying processing, it is possible to dry the liquid without being affected by surface tension. That is, it is possible to suppress the pattern from collapsing during the drying processing.

In the embodiment, the IPA liquid is used as a drying prevention liquid and CO2 is used as the processing fluid. However, a liquid other than the IPA may be used as the drying prevention liquid, or a fluid other than CO2 may be used as the processing fluid.

As illustrated in FIG. 7, the processing container 31 is provided with a first protrusion 31c and a second protrusion 31d protruding to the depth side in the opening direction (in this case, the X-axis negative direction side) from the opening 31b. The first protrusion 31c protrudes from the lower portion of the opening 31b toward the X-axis negative direction side and the second protrusion 31d protrudes from the upper portion of the opening 31b toward the X-axis negative direction side.

A plurality of (here, two) first insertion holes 31e are formed in the first protrusion 31c to communicate the top surface and the bottom surface of the first protrusion 31c with each other. In addition, in the second protrusion 31d, a plurality of (here, two) second insertion holes 31f are formed at the positions respectively facing the plurality of first insertion holes 31e to communicate the top surface and the bottom surface of the second protrusion 31d.

In addition, the drying unit 18 includes a plurality of (here, two) lock members 42. The lock members 42 are respectively inserted into a plurality of first insertion holes 31e formed in the first protrusion 31c.

Figure 8A:
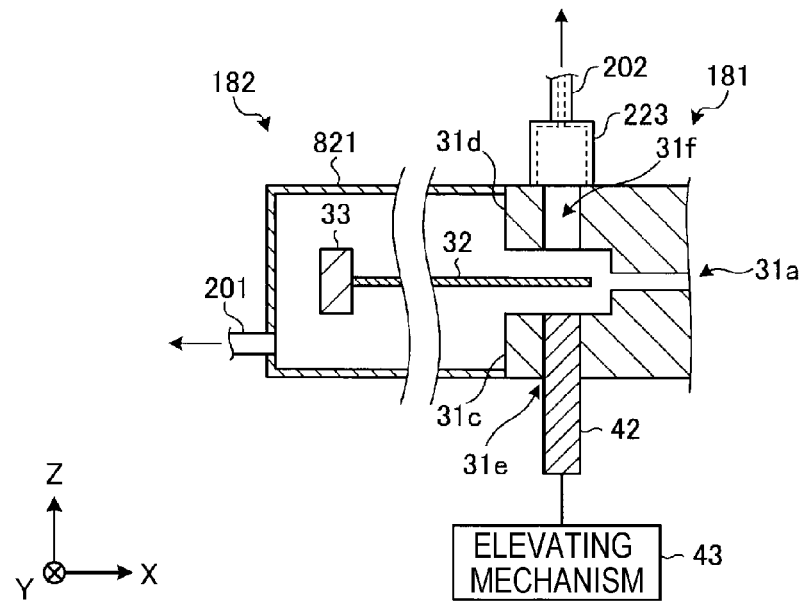
FIG. 8A is a schematic cross-sectional view of a delivery area.
Figure 8B:
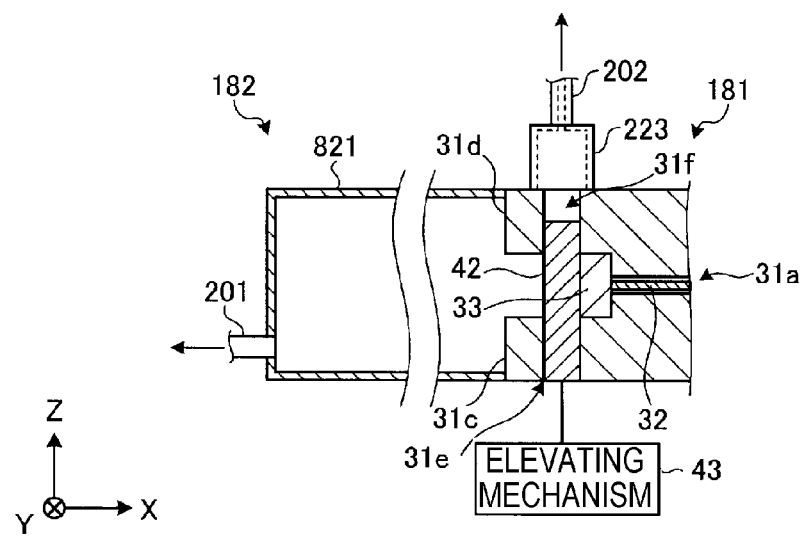
FIG. 8B is a schematic cross-sectional view of the delivery area.

Here, the operation of the lock members 42 will be described with reference to FIGS. 8A and 8B. FIGS. 8A and 8B are schematic cross-sectional views of the delivery area 182. FIG. 8A illustrates a state where the holding body 32 and the lid 33 are disposed in the delivery area 182, and FIG. 8B illustrates a state where the holding body 32 and the lid body 33 are disposed in the processing area 181.

As illustrated in FIG. 8A, an elevating mechanism 43 is connected to the lock members 42 to move the lock members 42 up and down.

As illustrated in FIG. 8B, first, the processing space 31a is hermetically sealed by the lid 33 by moving the holding body 32 and the lid 33 using a moving mechanism (not illustrated). Thereafter, the drying unit 18 raises the lock members 42 using the elevating mechanism 43, so that the lock members 42 are respectively inserted into the second insertion holes 31f formed in the second protrusion 31d.

The lock members 42 press the lid 33 toward the processing space 31a against the internal pressure caused by the supercritical fluid supplied to the processing space 31a. Accordingly, it is possible to maintain the hermetically sealed state of the processing space 31a by the lid 33.

The delivery area 182 is covered with a housing 821. The housing 821 accommodates the lid 33 and the holding body 32.

A first exhaust pipe 201 through which the atmosphere discharged from the housing 821 circulates is connected to the housing 821. Further, a second exhaust pipe 202 is connected to the second protrusion 31d. Specifically, the second exhaust pipe 202 is connected to the second insertion holes 31f through a buffer 223. The buffer 223 has an inner space wider than the second insertion holes 31f.

The second exhaust pipe 202 and the buffer 223 are provided in order to evacuate the moving space of the lock members 42, specifically, the first insertion holes 31e, the second insertion holes 31f, and the space between the first protrusion 31c and the second protrusion 31d. In such a space, when the lock members 42 are raised or lowered, particles may be generated due to the rubbing of the lock members 42 with the lid 33 or the processing container 31. According to the drying unit 18, by evacuating the moving space of the locking members 42 using the second exhaust pipe 202 and the buffer 223, it is possible to efficiently discharge the particles generated as the locking members 42 are raised and lowered to the outside of the delivery area 182.

During the supercritical drying process, the processing container 31 is brought into a high-temperature state of, for example, about 100 degrees, and an ascending airflow is generated in the second insertion hole 31f. When the second exhaust pipe 202 is directly connected to the second insertion holes 31f, the flow of the exhaust gas collides with the ascending airflow, which may cause disturbance of the air flow. On the other hand, by providing the buffer 223, since the airflow of the exhaust gas and the ascending airflow do not directly collide with each other, disturbance of the airflow hardly occurs. Therefore, it becomes possible to discharge particles to the outside more efficiently.

[5. Configuration of Exhaust Path of Processing Block]

Figure 9:
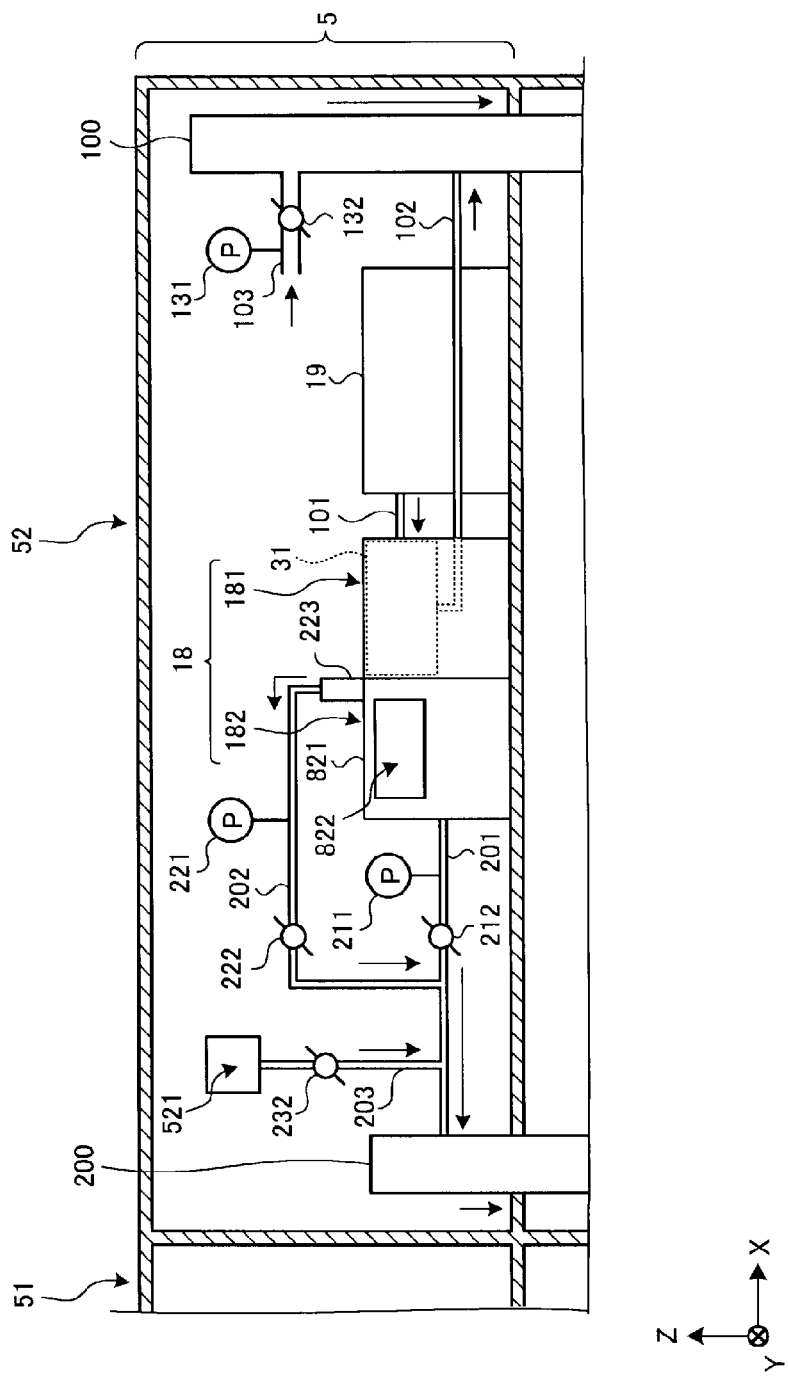
FIG. 9 is a view illustrating a configuration example of an exhaust path of a processing block.

Next, the configuration of the exhaust path of the processing block 5 will be described with reference to FIG. 9. FIG. 9 is a view illustrating a configuration example of the exhaust path of the processing block 5.

As illustrated in FIG. 9, each processing block 5 is partitioned into a liquid processing block 51 in which the liquid processing unit 17 is disposed, and a drying block 52 in which the drying unit 18 and the supply unit 19 are disposed. The liquid processing block 51 and the drying block 52 are partitioned by a partition wall. In addition, each of the plurality of drying blocks 52 disposed in multiple stages is also partitioned by a partition wall.

The drying block 52 is provided with a first common exhaust pipe 100 and a second common exhaust pipe 200. The first common exhaust pipe 100 and the second common exhaust pipe 200 extend in the vertical direction so as to penetrate the plurality of processing blocks 5 disposed in multiple stages. That is, the first common exhaust pipe 100 and the second common exhaust pipe 200 are commonly used by the plurality of processing blocks 5 disposed in multiple stages. Specifically, one first common exhaust pipe 100 and one second common exhaust pipe 200 are disposed on each side of the transport block 4.

The second common exhaust pipe 200, the drying unit 18, the supply unit 19, and the first common exhaust pipe 100 are sequentially arranged in this order from the liquid processing block 51 side. That is, the first common exhaust pipe 100 is disposed at a position close to the supply unit 19 among the drying unit 18 and the supply unit 19, and the second common exhaust pipe 200 is disposed at a position close to the drying unit 18 among the drying unit 18 and the supply unit 19.

The first common exhaust pipe 100 is used for discharging the supercritical fluid from the drying unit 18. Specifically, the first common exhaust pipe 100 is connected to an individual exhaust pipe 102 provided at each stage of the plurality of drying blocks 52 disposed in multiple stages. The supercritical fluid supplied from the supply unit 19 to the processing container 31 of the drying unit 18 through the supply pipe 101 flows out to the first common exhaust pipe 100 through the individual exhaust pipe 102 and is discharged from the first common exhaust pipe 100 to the outside of the processing block 5.

In addition, a block exhaust pipe 103 is connected to the first common exhaust pipe 100 to discharge the atmosphere in each drying block 52. The block exhaust pipe 103 is provided with a pump 131 and a damper 132 configured to adjust the opening degree of the block exhaust pipe 103.

The block exhaust pipe 103, the pump 131, and the damper 132 are provided at each stage of the plurality of drying blocks 52 disposed in multiple stages. In this way, in the substrate processing system 1, each stage of the plurality of drying blocks 52 disposed in multiple stages is partitioned, and the atmosphere in each drying block 52 is individually exhausted for each drying block 52. Since the processing fluid heated to a predetermined temperature is supplied to the processing area 181, there is a possibility that a difference in the temperature of atmosphere occurs between the drying blocks 52. By with the configuration described above, it is possible to reduce the influence according the temperature difference of the atmosphere between the drying blocks 52.

In the substrate processing system 1, the individual exhaust pipe 102 configured to discharge the supercritical fluid or the processing fluid from the processing container 31 and the block exhaust pipe 103 configured to exhaust the atmosphere in the drying block 52 are connected to one first common exhaust pipe 100. Thus, for example, when discharging the supercritical fluid or the processing fluid from the processing container 31, it is possible to suppress the pressure fluctuation in the first common exhaust pipe 100 due to discharge of the processing fluid by adjusting the discharge amount of the atmosphere in the drying block 52 using the damper 132 of the block exhaust pipe 103.

The block exhaust pipe 103 has a shape protruding from the first common exhaust pipe 100. Thus, it is possible to suppress the supercritical fluid or the processing fluid discharged from the processing vessel 31 from flowing backward through the first common exhaust pipe 100 and out of the block exhaust pipe 103.

Subsequently, the second common exhaust pipe 200 will be described. The second common exhaust pipe 200 is used for evacuating the delivery area 182.

Specifically, the second common exhaust pipe 200 is connected to the above-described first exhaust pipe 201. The first exhaust pipe 201 is provided with a pump 211 and a damper 212 configured to adjust the opening degree of the first exhaust pipe 201. The first exhaust pipe 201 disposed in each stage is connected to the second common exhaust pipe 200.

One end of the second exhaust pipe 202 is connected to the buffer 223, and the other end thereof is connected to the first exhaust pipe 201. The second exhaust pipe 202 is provided with a pump 221 and a damper 222 configured to adjust the opening degree of the second exhaust pipe 202. In addition, an opening 822 is provided on the transport block 4 side surface of the housing 821.

Air (clean air) in the transport block 4 flows into the housing 821 from the opening 822. The air flowing into the housing 821 flows out to the second common exhaust pipe 200 through the first exhaust pipe 201 or the second exhaust pipe 202 and is discharged from the second common exhaust pipe 200 to the outside of the processing block 5. In addition, the wafer W is also carried into/out from the housing 821 by the transport device 16 through the opening 822.

As described above, the substrate processing system 1 according to the embodiment includes a first high-pressure exhaust path configured to exhaust the supercritical processing fluid from the processing area 181 (the first common exhaust pipe 100 and the individual exhaust pipe 102), and a second normal pressure exhaust path configured to evacuating the delivery area 182 (the normal second exhaust pipe 200, the first exhaust pipe 201, and the second exhaust pipe 202).

In addition, an opening 521 is provided in the transport block 4 side surface of the drying block 52. A third exhaust pipe 203 is connected to the opening 521. One end of the third exhaust pipe 203 is connected to the opening 521, and the other end thereof is connected to the first exhaust pipe 201. The third exhaust pipe 203 is provided with a damper 232 configured to adjust the opening degree of the third exhaust pipe 203.

The opening 521, the third exhaust pipe 203, and the damper 232 are provided, for example, in order to suppress the disturbance of the airflow of the transport block 4 during the maintenance of the drying unit 18.

Figure 10A:
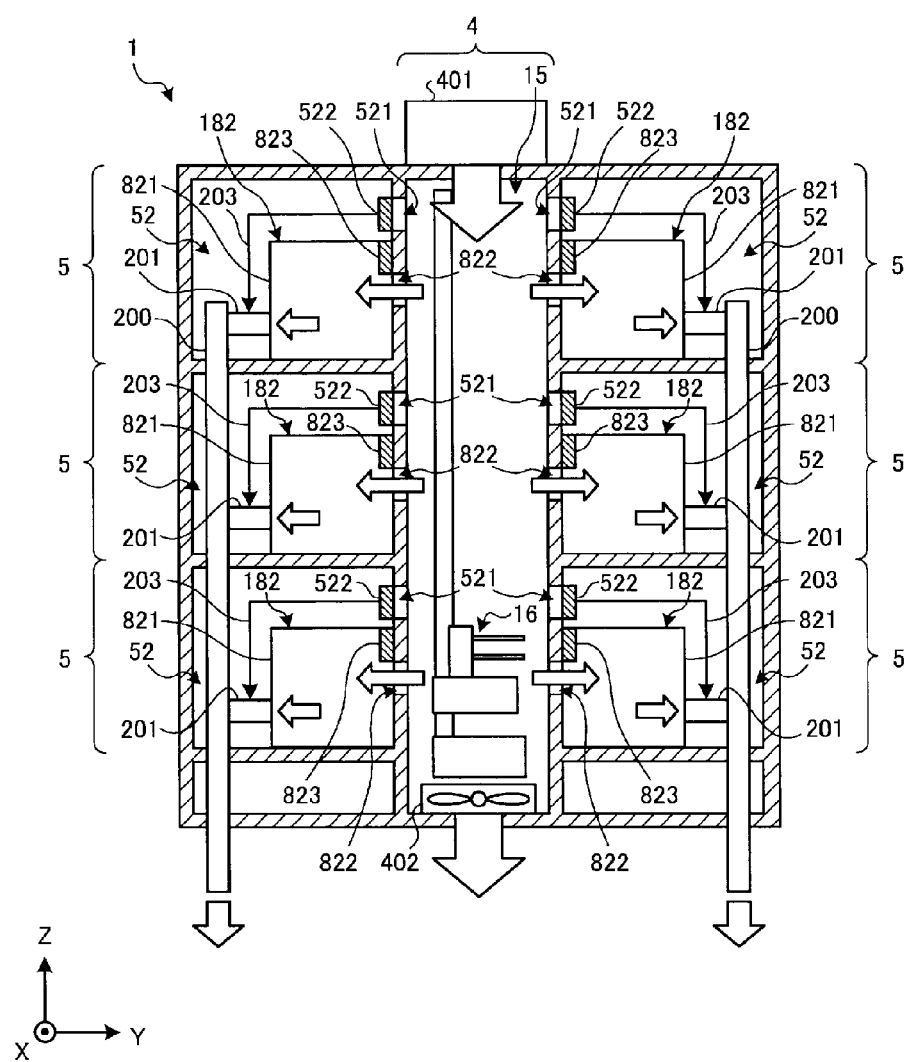
FIG. 10A is a schematic cross-sectional view of a substrate processing system according to an embodiment when viewed from the rear side.
Figure 10B:
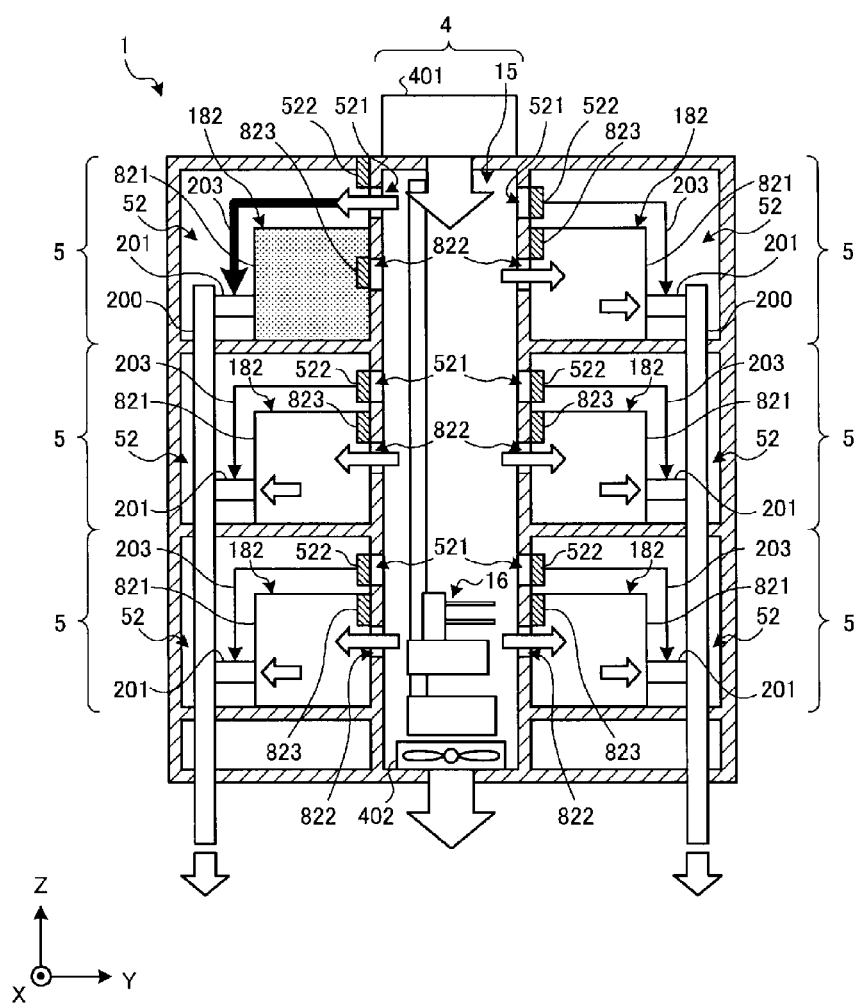
FIG. 10B is a schematic cross-sectional view of the substrate processing system according to the embodiment when viewed from the rear side.

This point will be described with reference to FIGS. 10A and 10B. FIGS. 10A and 10B are schematic cross-sectional views of the substrate processing system 1 according to the embodiment when viewed from the rear side.

As illustrated in FIG. 10A, an FFU 401 is disposed above the transport area 15 in the transport block 4. Further, a fan 402 is disposed in the lower portion of the transport area 15. Due to the FFU 401 and the fan 402, a down flow is formed in the transport area 15.

Each drying block 52 is provided with a shutter 823 capable of opening/closing the opening 822 and a shutter 522 capable of opening/closing the opening 521.

In a normal state in which a series of substrate processings are performed, the controller 61 of the substrate processing system 1 executes a series of substrate processings in the state where the shutter 823 is opened and the shutter 522 is closed. Therefore, in the normal state, the air (clean air) in the transport area 15 of the transport block 4 flows into the housing 821 through the opening 822. The air flowing into the housing 821 is discharged to the outside through the first exhaust pipe 201 and the second common exhaust pipe 200.

Meanwhile, as illustrated in FIG. 10B, when any one drying block 52 shifts to a maintenance state, the controller 61 closes the shutter 823 of the drying block 52 in the maintenance state and opens the shutter 522. As a result, the air in the transport area 15 flows into the third exhaust pipe 203 through the opening 521. At this time, the controller 61 adjusts the damper 232 (see, e.g., FIG. 9) such that the air having the same flow rate as that of the air flowing into the housing 821 in the normal state flows into the third exhaust pipe 203. The air flowing into the third exhaust pipe 203 is discharged to the outside through the first exhaust pipe 201 and the second common exhaust pipe 200.

The maintenance state refers to a state where a processing in the corresponding drying block 52 is temporarily stopped, for example, in order to perform cleaning and inspection in the drying block 52 or due to occurrence of abnormality in the drying block 52.

In this way, in the maintenance state where the shutter 823 of the opening 822 is closed, it is possible to keep the supply/exhaust balance of the gas in the transport area 15 constant by causing the air in the transport area 15 to be taken in from the opening 521 instead of the opening 822. As a result, even when the drying block 52 shifts to the maintenance state, since the disturbance of an airflow hardly occurs in the transport area 15, it is possible to suppress occurrence of variation in the drying quantity of the liquid film or the like on the wafer W after the liquid film forming processing due to, for example, the disturbance of the airflow.

As described above, the substrate processing system 1 (an example of the substrate processing apparatus) according to the embodiment includes a transport block 4 and a plurality of processing blocks 5. In the transport block 4, a transport device 16 configured to transport a wafer W (e.g., a substrate) is disposed. The plurality of processing blocks 5 are disposed adjacent to the transport block 4 and process a wafer W transported by the transport device 16. In addition, each processing block 5 includes one liquid processing unit 17 and one drying unit 18. The liquid processing unit 17 performs a liquid film forming processing for forming a liquid film on the top surface of the wafer W. The drying unit 18 performs a supercritical drying processing of drying the wafer W after the liquid film forming processing by bringing the wafer W after the liquid film forming processing into contact with the processing fluid in the supercritical state. In addition, the liquid processing unit 17 and the drying unit 18 included in the same processing block 5 are disposed on the same side with respect to the movement direction of the transport device 16 of the transport block 4.

Thus, with the substrate processing system 1 according to the embodiment, it is possible to optimize a series of substrate processings including a liquid film forming processing and a supercritical drying processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a transport block including therein a first holder configured to transport a substrate;
at least one pair of processing blocks having the transport block disposed therebetween and configured to process the substrate transported by the first holder; and
a carrier section disposed adjacent to the transport block having a second holder configured to hold the substrate,
wherein each of the processing blocks includes:
a liquid processing chamber configured to perform a liquid film forming processing so as to form a liquid film on a top surface of the substrate,
a drying chamber configured to perform a supercritical drying processing in which the substrate after the liquid film forming processing is dried by bringing the substrate after the liquid film forming processing into contact with a processing fluid in a supercritical state, the drying chamber including a processing area in which the supercritical drying process is performed and a delivery area in which delivery of the substrate is performed between the transport block and the processing area, and
a supply unit including a housing, said supply unit configured to supply the processing fluid to the drying chamber,
wherein the liquid processing chamber, the processing area of the drying chamber, the delivery area of the drying chamber, and the housing are included in a same processing block along the transport block and disposed on a same side with respect to a movement direction of the first holder of the transport block, the liquid processing chamber is positioned directly adjacent to the carrier section, the delivery area is positioned directly adjacent to the liquid processing chamber and the transport block, and the housing is positioned directly adjacent to a first side of the processing area of the drying chamber, and
wherein the first side is on a side of the processing area opposite a side of the processing area which is adjacent to the delivery area of the drying chamber, and the housing is positioned in the processing block further from the carrier section than the liquid processing chamber, the processing area of the drying chamber, or the delivery area of the drying chamber.

2. The substrate processing apparatus of claim 1, wherein the first holder transports the substrate after the liquid film forming processing between the liquid processing chamber and the drying chamber which are included in the same processing block.

3. The substrate processing apparatus of claim 1, wherein the at least one pair of processing blocks are disposed in multiple stages in a vertical direction.

4. The substrate processing apparatus of claim 3, wherein the second holder is disposed adjacent to the transport block and is configured to receive the substrate thereon, wherein the first holder transports the substrate between each stage of the at least one pair of processing blocks and the second holder.

5. The substrate processing apparatus of claim 3, wherein at least one processing block of the at least one pair of processing blocks are disposed on each side of the movement direction of the first holder of the transport block, and the at least one processing block of the at least one pair of processing blocks disposed on one side of the transport block and the at least one processing block of the at least one pair of processing blocks disposed on another side of the transport block are disposed to be symmetrical to each other across the transport block in a plan view.

6. The substrate processing apparatus of claim 2, wherein at least one processing block of the at least one pair of processing blocks are disposed on each side of the movement direction of the first holder of the transport block, and the at least one processing block of the at least one pair of processing blocks disposed on one side of the transport block and the at least one processing block of the at least one pair of processing blocks disposed on another side of the transport block are disposed to be symmetrical to each other across the transport block in a plan view.

7. The substrate processing apparatus of claim 2, wherein the at least one pair of processing blocks are disposed in multiple stages in a vertical direction.

8. The substrate processing apparatus of claim 7, wherein the second holder is disposed adjacent to the transport block and is configured to receive the substrate thereon, wherein the first holder transports the substrate between each stage of the at least one pair of processing blocks and the second holder.

9. The substrate processing apparatus of claim 7, wherein at least one processing block of the at least one pair of processing blocks are disposed on each side of the movement direction of the first holder of the transport block, and the at least one processing block of the at least one pair of processing blocks disposed on one side of the transport block and the at least one processing block of the at least one pair of processing blocks disposed on another side of the transport block are disposed to be symmetrical to each other across the transport block in a plan view.

10. The substrate processing apparatus of claim 1, wherein at least one processing block of the at least one pair of processing blocks are disposed on each side of the movement direction of the first holder of the transport block, and the at least one processing block of the at least one pair of processing blocks disposed on one side of the transport block and the at least one processing block of the at least one pair of processing blocks disposed on another side of the transport block are disposed to be symmetrical to each other across the transport block in a plan view.

11. The substrate processing apparatus of claim 1, wherein the drying chamber further includes a plurality of locks configured to press a lid towards the processing area of the drying chamber.

12. The substrate processing apparatus of claim 11, wherein the drying chamber includes a process container having a plurality of protrusions, each protrusion including a plurality of openings through which the plurality of locks are configured to be inserted.

* * * * *